US009560793B2

(12) United States Patent
Leigh et al.

(10) Patent No.: US 9,560,793 B2
(45) Date of Patent: Jan. 31, 2017

(54) BLADE ENCLOSURE

(75) Inventors: Kevin B. Leigh, Houston, TX (US);
David W. Sherrod, Tomball, TX (US);
George D. Megason, Spring, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 50 days.

(21) Appl. No.: 14/396,731

(22) PCT Filed: Apr. 27, 2012

(86) PCT No.: PCT/US2012/035554
§ 371 (c)(1),
(2), (4) Date: Oct. 23, 2014

(87) PCT Pub. No.: WO2013/162605
PCT Pub. Date: Oct. 31, 2013

(65) Prior Publication Data
US 2015/0098173 A1     Apr. 9, 2015

(51) Int. Cl.
*G06F 1/20* (2006.01)
*H05K 7/14* (2006.01)
(Continued)

(52) U.S. Cl.
CPC .......... *H05K 7/20727* (2013.01); *G06F 1/183* (2013.01); *G06F 1/20* (2013.01);
(Continued)

(58) Field of Classification Search
CPC ..................... G06F 1/206; G06F 1/181–1/189;
G06F 1/20; G06F 2200/201; H05K 7/1487; H05K 7/20145; H05K 7/20727; H05K 7/20554–7/20572; H05K 7/20718–7/20736
(Continued)

(56) References Cited

U.S. PATENT DOCUMENTS 7,113,401 B2    9/2006  Becker et al.
7,722,359 B1    5/2010  Frangioso, Jr. et al.
(Continued)

FOREIGN PATENT DOCUMENTS

WO    WO2011138079    11/2011

OTHER PUBLICATIONS

Sealevel, DB9 Female to RJ45 Modular Adapter (RJ9s8), Feb. 21, 2010.*
(Continued)

*Primary Examiner* — Zachary M Pape
*Assistant Examiner* — Amir Jalali
(74) *Attorney, Agent, or Firm* — Brooks, Cameron & Huebsch, PLLC

(57) ABSTRACT

Enclosures and systems that can control airflow and signal connectivity in a blade enclosure are provided. Some examples include a front section including a number of blade server modules, a rear section including a number of switch modules; and a middle section having a number of openings and a number of connectors, wherein the middle section controls airflow between the front section and the rear section in the blade enclosure with the number of openings and the middle section controls signal connectivity between a number of blades in the number of blade server modules and a number of switches in the number of switch modules with the number of connectors.

19 Claims, 4 Drawing Sheets

(51) Int. Cl.
*H05K 7/20* (2006.01)
*G06F 1/18* (2006.01)

(52) U.S. Cl.
CPC ....... *H05K 7/1487* (2013.01); *H05K 7/20145* (2013.01); *H05K 7/20736* (2013.01)

(58) Field of Classification Search
USPC .............. 361/679.49–679.51, 695, 724–727; 454/184–186, 133; 165/59, 244
See application file for complete search history.

(56) References Cited

U.S. PATENT DOCUMENTS

| | | | | |
|---|---|---|---|---|
| 8,064,200 | B1* | 11/2011 | West | H05K 7/20563 |
| | | | | 361/694 |
| 8,125,779 | B2 | 2/2012 | Aybay et al. | |
| 9,277,680 | B2* | 3/2016 | Roesner | H05K 7/20754 |
| 2004/0100765 | A1* | 5/2004 | Crippen | G06F 1/20 |
| | | | | 361/679.48 |
| 2005/0237724 | A1* | 10/2005 | Fiorentino | H05K 7/1457 |
| | | | | 361/752 |
| 2007/0230111 | A1* | 10/2007 | Starr | G11B 33/125 |
| | | | | 361/679.31 |
| 2008/0091810 | A1 | 4/2008 | Blinick et al. | |
| 2008/0180896 | A1* | 7/2008 | McClure | G06F 1/20 |
| | | | | 361/727 |
| 2008/0180903 | A1* | 7/2008 | Bisson | H05K 7/20736 |
| | | | | 361/679.49 |
| 2008/0310107 | A1* | 12/2008 | Vinson | H05K 7/20736 |
| | | | | 361/695 |
| 2008/0316704 | A1* | 12/2008 | Vinson | G06F 1/20 |
| | | | | 361/695 |
| 2009/0016019 | A1* | 1/2009 | Bandholz | H05K 7/20736 |
| | | | | 361/695 |
| 2010/0002382 | A1* | 1/2010 | Aybay | H05K 7/20563 |
| | | | | 361/695 |
| 2010/0014248 | A1* | 1/2010 | Boyden | H05K 7/20563 |
| | | | | 361/695 |
| 2011/0155503 | A1 | 6/2011 | Joshi | |
| 2012/0050986 | A1* | 3/2012 | Riebel | H05K 7/1488 |
| | | | | 361/679.48 |
| 2012/0170191 | A1* | 7/2012 | Jensen | G06F 1/185 |
| | | | | 361/679.02 |
| 2012/0327597 | A1* | 12/2012 | Liu | H05K 7/20736 |
| | | | | 361/692 |
| 2013/0215563 | A1* | 8/2013 | Behziz | G06F 1/183 |
| | | | | 361/679.02 |
| 2014/0002988 | A1* | 1/2014 | Roesner | G06F 1/20 |
| | | | | 361/679.49 |
| 2014/0078668 | A1* | 3/2014 | Goulden | H05K 7/20736 |
| | | | | 361/679.47 |
| 2014/0108692 | A1* | 4/2014 | Doglio | G06F 1/183 |
| | | | | 710/300 |
| 2014/0369001 | A1* | 12/2014 | Miller | H05K 7/1425 |
| | | | | 361/694 |

OTHER PUBLICATIONS

ISA/KR, International Search Report, mailed Dec. 27, 2012, PCT/US2012/035554.

* cited by examiner

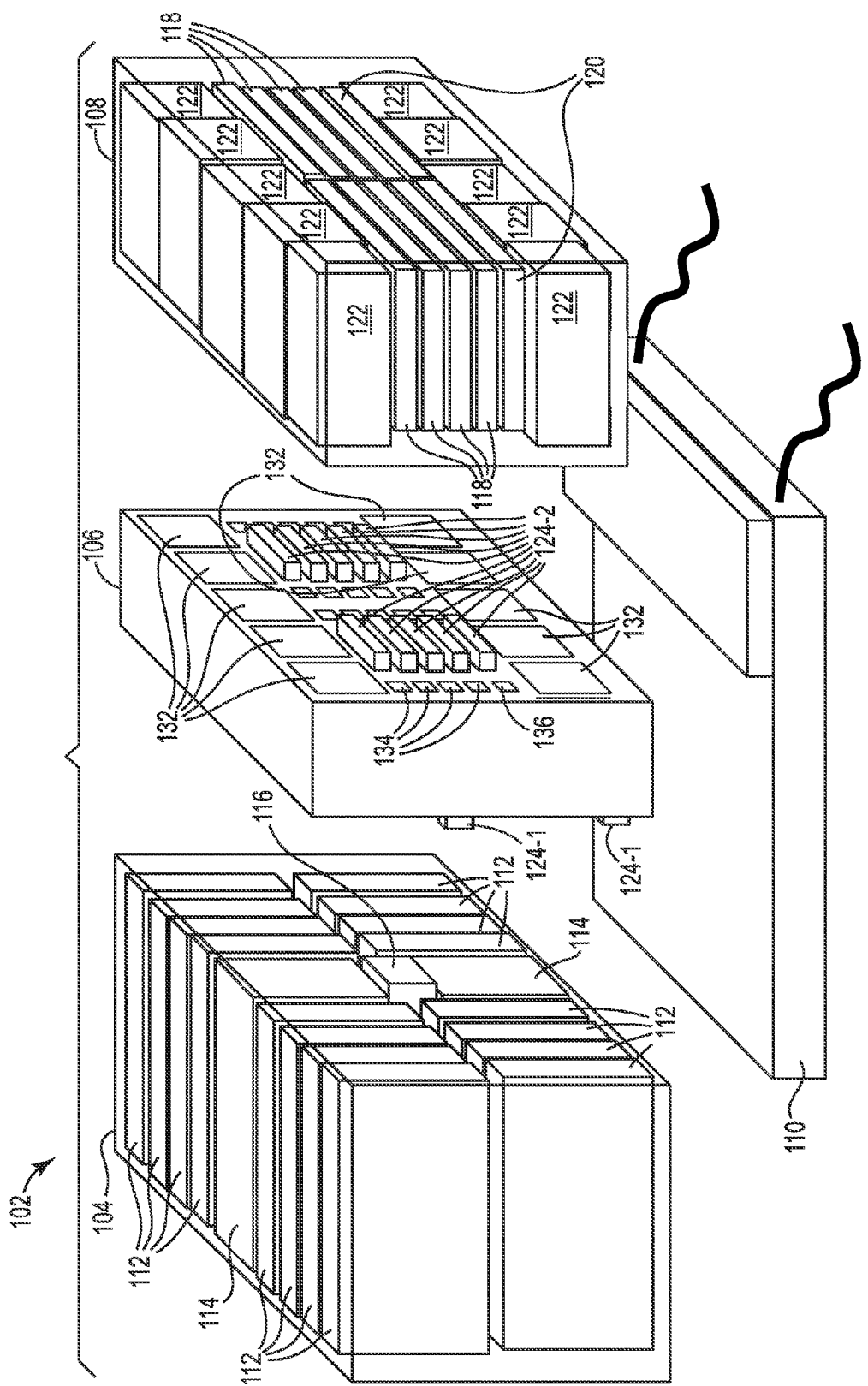

BLADE ENCLOSURE

BACKGROUND

In a blade enclosure, blade server modules, that are housed in the blade enclosure, can be coupled to switch modules, that are housed in the blade enclosure. The blade server modules and switch modules can be coupled together via a rigid printed circuit board (PCB). A PCB can have copper traces that provide a direct high-speed connection for signals transferred between the blades and switches in the blade server modules and switch modules, but using a PCB to couple blades to switches can limit the configurations that the blade server modules and switch modules can have in their enclosures and also can limit cooling of the blades and switches by preventing airflow between the blade server modules and switch modules.

BRIEF DESCRIPTION OF THE DRAWINGS

FIG. 1 illustrates a blade enclosure having a front section, a middle section, a rear section, and a lower section according the present disclosure.

DETAILED DESCRIPTION

Figure 2A:
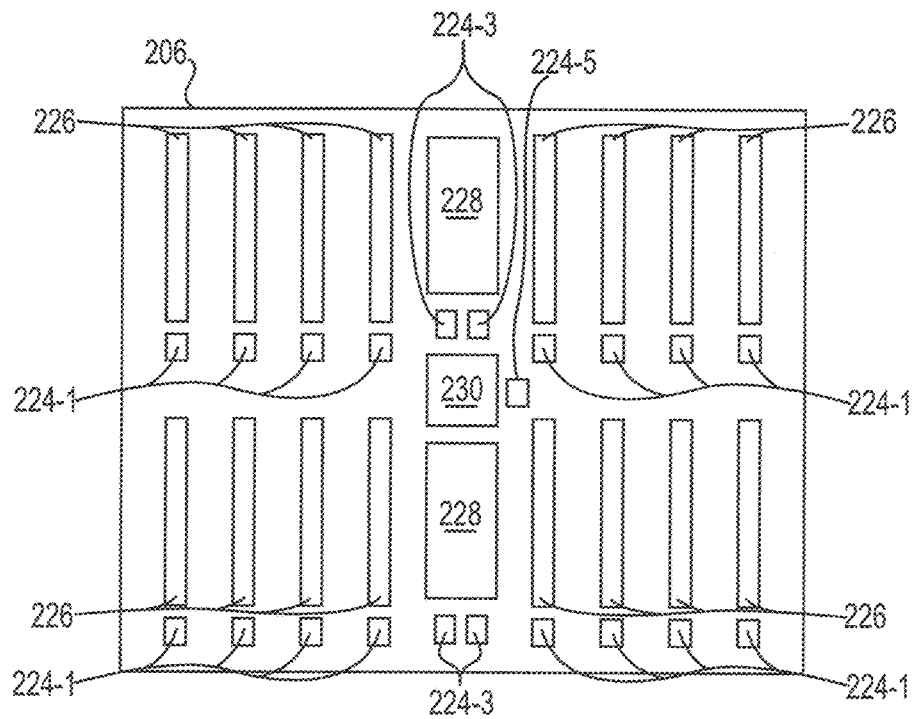
FIG. 2A illustrates the end of the middle section of a blade enclosure that couples to the front section of a blade enclosure according to the present disclosure.

Some previous networking systems that use a PCB to couple blades to switches can be limited by certain aspects of the PCB. A PCB cannot have dimensions larger than 24" by 24" to be economical. Therefore, the configuration of and the number of blades sever modules in a blade enclosure and the configuration of and the number of switch modules in a blade enclosure can be constrained by the dimensions of the PCB. Also, the PCB can restrict airflow between the blade sever modules and switch modules limiting the cooling of the blades and switches. Openings can be formed in the PCB to allow for airflow between the blades and switches, but forming openings in the PCB reduces the area on the PCB that can be used for transferring signals between the blades and the switches. In addition, large PCBs can have reduced ability to route high-speed signals, e.g., signals 25 Gbps and above.

Enclosures and systems that can control airflow and signal connectivity in a blade enclosure are provided. Some examples include a front section including a number of blade server modules, a rear section including a number of switch modules, and a middle section having a number of openings and a number of connectors, wherein the middle section controls airflow between the front section and the rear section in the blade enclosure with the number of openings and the middle section controls signal connectivity between a number of blades in the number of blade server modules and a number of switches in the number of switch modules with the number of connectors.

In some examples of the present disclosure, the number of connectors and the number of openings can have a number of configurations to allow the enclosure to couple a number of blades and a number of switches in various configurations. For example, the connectors and openings of an enclosure can be configured to match the configuration of the portion of a blade enclosure that is housing the blades and the configuration of the portion of a blade enclosure that is housing the switches.

In the following detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" can refer to one or more of a particular thing. For example, a number of blades can refer to one or more blades.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 206 in FIG. 2A. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

FIG. 1 illustrates a blade enclosure 102 having a front section 104, a middle section 106, a rear section 108, and a lower section 110 according the present disclosure. FIG. 1 illustrates a blade enclosure 102 having a middle section 106 that couples to a front section 104 having a number of blade server modules 112 and to a rear section 108 having a number of switches modules 118 according to the present disclosure. The middle section 106 can control the airflow, signal connectivity, and power distribution for the blade enclosure 102.

The front section 104 includes a number of blade server modules 112, storage modules 114, and front fan modules 116. The rear section 108 includes a number of switch modules 118, enclosure manager modules 120, and rear fan modules 122. The lower section 110 includes power modules that can include a number of powers sources and fans to provide power to the components of the blade enclosure 102.

The middle section 106 includes a number of openings (described in association with FIGS. 2A and 2B) and a number of plenums (described in associated with FIGS. 3A and 3B) to allow airflow through the blade enclosure 102 between the front section 104 and the rear section 108 via the middle section 106. The middle section 106 includes a number of connectors (described in association with FIG. 2A) that connect the blade server modules to middle section 106 and a number of connectors (described in associated with FIG. 2A) that connect the storage modules to middle section 106. The middle section 106 includes a number of connectors (described in association with FIG. 2B) that connect the switch modules to middle section 106 and a number of connectors (described in association with FIG. 2B) that connect the enclosure manager modules to middle section 106.

In the example illustrated in FIG. 1, the middle section 106 includes a number of openings and a number of connectors. In FIG. 1, connectors 124-1 that can be coupled to blade server modules 112 and connectors 124-2 can be coupled to switch modules 118 are illustrated. In some examples, connectors (not shown in FIG. 1) that can couple to storage modules, enclosure manager modules, front fan modules, and/or rear fan modules can be included on the middle section 106. In FIG. 1, openings 132 that can be coupled to rear fan modules 122, openings 134 that can be coupled to switch modules 118, and openings 136 that can be coupled to enclosure manager modules 120 are illustrated. In some examples, openings (not shown in FIG. 1) that can couple to blade server modules, front fan modules, and/or storage modules can be included in the middle section 106.

The number of connectors that connect the blade server modules 112, switch modules 118, enclosure manager modules 120, and storage modules 114 to middle section 106 can be coupled together to provide high and/or low speed signal connectivity between the blade server modules 112, switch modules 118, enclosure manager modules 120, and storage modules 114. The connectors of middle section 106 can be coupled together with wires and/or optical fibers.

In some examples, the openings and connectors in middle section 106 can be used to manage the airflow, signal connectivity, and power distribution in the blade enclosure 102. The middle section 106 can manage the airflow in the blade enclosure 102 by providing opening and plenums for air to move from the blade server modules 112 and storage modules 114 in the front section 104 to the rear fan modules 122 in the rear section 108. In some examples, air can be pulled into the blade server modules 112 and storage modules 114 of the blade enclosure by fans in the rear fan modules 122, the air can pass through the blade server modules 122 and storage modules 114 and into plenums in the middle section 106. The airflow can continue out of the plenums in middle section 106 into the rear fan modules 122. The airflow can exit the blade enclosure 102 out the rear fan modules 122.

The middle section 106 can manage the airflow in the blade enclose 102 by providing openings and a plenum for air to move from the front fan modules 116 in the front section 104 to the switch modules 118 and enclosure manager modules 120 in the rear section 108. In some examples, air can be pushed into the blade enclosure 102 by fans in the front fan modules 116, the air can pass through the front fan modules 116 and into a plenum in the middle section 106. The airflow can continue out of the plenum in the middle section 106 into the switch modules 118 and enclosure manager modules 120. The airflow can exit the blade enclosure 102 out the switch modules 118 and the enclosure manager modules 120.

The middle section 106 can manage signal connectivity and power distribution for the blade enclosure 102 by providing connectors, where the signal connectivity can be electrical connectors and/or optical connectors, for example, along with wires and/or optical fiber cables to couple the blade server modules 112, the switch modules 118, the storage modules 114, the enclosure manager modules 120, the front fan modules 116, and the rear fan modules 122 together. The connectors coupled to the wires and/or optical fibers can transfer signals and/or electricity between the blade server modules 112, the switch modules 118, the storage modules 114, and the enclosure manager modules 120, front fan modules 116 and rear fan modules 122.

FIG. 2A illustrates the end of the middle section of a blade enclosure that couples to the front section of a blade enclosure according to the present disclosure. Middle section 206 includes a number of connectors 224-1, 224-3, and 224-5 and a number of openings and louvers 226, 228, and 230. The connectors 224-1 can physically and electrically couple a number of blade server modules to middle section 206. Each connector 224-1 can be coupled to a blade in a blade server module. The connectors 224-1 can be floated, e.g., have a number of degrees of freedom for movement, in middle section 206; therefore connectors 224-1 can move to align with the blade sever modules when coupling the blade server modules to connectors 224-1. For example, connectors can move approximately 1-3 mm in each direction.

Connectors 224-3 can physically and electrically couple a number of storage modules to middle section 206. Each connector 224-3 can be coupled to a storage manager in a storage module. The connectors 224-3 can be floated in middle section 206 to allow connectors 224-3 to move and align with the storage manager modules when coupling the storage modules to connectors 224-3.

Connector 224-5 can physically and electrically couple a front fan module to middle section 206. The front fan modules can move air between the front and rear sections through the middle section of the blade enclosure. Connector 224-5 can be coupled to a number of fans in a front fan module. The connectors 224-5 can be floated in middle section 206 to allow connector 224-5 to move and align with the front fan module when coupling the front fan module to connector 224-5.

In some examples, each of the number of connectors 224-1 can be associated with an opening and louver 226. Openings and louvers 226 can allow airflow between a blade server module in the front section blades and the middle section 206. For example, as a blade server module is coupled to a connector 224-1, louver 226 can be actuated and opened by the blade server module to allow airflow between the blade server module and the middle section 206. For example, when blade server modules are coupled to connectors 224-1, the blade server modules can contact louver actuators associated with openings and louvers 226 to open the louvers 226 and allow airflow between the blade server modules and middle section 206. In some examples, louvers can be motorized and receive a signal to open for airflow control.

In some examples, each of the number of connectors 224-3 can be associated with an opening and louver 228. Openings and louvers 228 can allow airflow between storage modules and middle section 206. For example, as a storage module is coupled to a connector 224-3, louver 228 can be actuated and opened by the storage modules to allow airflow between the storage modules in the front section and the middle section 206.

Middle section 206 can also include an opening and louver 230. Opening and louver 230 can allow airflow between a front fan module in the front section and middle section 206. For example, as a front fan module is coupled to middle section 206, louver 230 can be actuated and opened by the front fan module to allow airflow between the front fan module and the middle section 206.

Figure 2B:
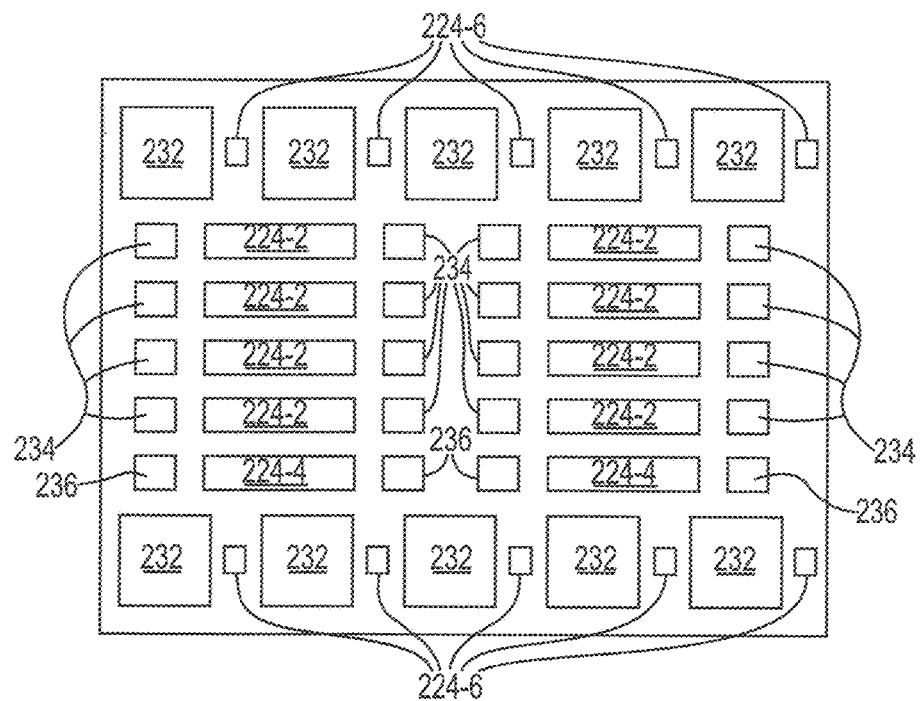
FIG. 2B illustrates the end of the middle section of a blade enclosure that couples to the rear section of a blade enclosure according to the present disclosure.

FIG. 2B illustrates the end of the middle section of a blade enclosure that couples to the rear section of a blade enclosure according to the present disclosure. Middle section 206 includes a number of connectors 224-2 and 224-4 and a number of openings and louvers 232, 234, and 236. The connectors 224-2 can physically and electrically couple a number of switch modules to middle section 206. Each connector 224-2 can be coupled to a switch in a switch module. The connectors 224-2 can be floated, e.g., have a number of degrees of freedom, in middle section 206; therefore connectors 224-2 can move to ease alignment with the switch modules when coupling the switch modules to connectors 224-2. The connectors can move, for example, 1-3 mm in each direction. Also, connectors 224-4 can physically and electrically couple a number of enclosure manager modules to middle section 206. The enclosure manager modules can control signal routing for the number of switches in the switch modules. Each connector 224-4 can be coupled to an enclosure manager module. The connectors 224-4 can be floated in middle section 206 to allow connectors 224-4 to move and align with the enclosure manager modules when coupling the enclosure manager modules to connectors 224-4.

Connectors 224-6 can physically and electrically couple a rear fan modules to middle section 206. The rear fan modules can move air between the front and rear sections through the middle section of the blade enclosure. Connectors 224-6 can be coupled to a number of fans in rear fan modules. The connectors 224-6 can be floated in middle section 206 to allow connector 224-6 to move and align with the rear fan modules when coupling the front fan module to connector 224-6.

In some examples, each of the number of connectors 224-2 can be associated with a pair of openings and louvers 234. Openings and louvers 234 can allow airflow between the switch modules and middle section 206. For example, as a switch module is coupled to a connector 224-2, louver 234 can be actuated and opened by the switch module to allow airflow between the switch module and the middle section 206. For example, when switch modules are coupled to connectors 224-2, the switch modules can contact the louver actuators associated with openings and louvers 234 to open louvers 234 and allow airflow between the switch modules and middle section 206.

In some examples, each of the number of connectors 224-4 can be associated with a pair of openings and louvers 236. Openings and louvers 236 can allow airflow between the enclosure manager modules and middle section 206. For example, as an enclosure manager module is coupled to a connector 224-4, louver 236 can be actuated and opened by the enclosure manager module to allow airflow between the enclosure manager module and the middle section 206. For example, when enclosure manager modules are coupled to connectors 224-4, the enclosure manager modules can contact the louver actuators associated with openings and louvers 236 to open louvers 236 and allow airflow between the enclosure manager modules and middle section 206.

In some examples, each of rear fan modules in the rear section can be associated with an opening and louver 232. Openings and louvers 232 can allow airflow between the rear fan modules and middle section 206. For example, as a rear fan module is coupled to middle section 206, louver 232 can be actuated and opened by the rear fan module to allow airflow between the rear fan module and the middle section 206. For example, when rear fan modules are coupled to middle section 206, the rear fan modules can contact the louver actuators associated with openings and louvers 232 to open louvers 232 and allow airflow between the rear fan modules and middle section 206.

In some examples, connectors 224-1, 224-2, 224-3, 224-4, 224-5, and 224-6 can be coupled together by a number of wires and/or optical fibers. The number of wires can be copper, for example, and the number of wires can transmit signals between the blade server modules, switch modules, storage modules, and enclosure manager modules coupled to connectors 224-1, 224-2, 224-3, 224-4, 224-5, and 224-6. The number of wires can supply electrical power from power modules to the blade server modules, switch modules, storage modules, enclosure manager modules, front fan modules, and rear fan modules coupled to connectors 224-1, 224-2, 224-3, and 224-4, 224-5, and 224-6. For example, a number of wires and/or optical fibers can couple each of the blade server modules coupled to a connector 224-1 to each of the storage modules coupled to a connector 204-3. A number of wires can couple each of the blade server modules coupled to a connector 224-1 to each of the switch modules coupled to a connector 224-2. A number of wires can couple each of the storage modules coupled to a connector 224-3 to each of the enclosure manager modules coupled to a connector 224-4. A number of wires can couple each of the switch modules coupled to a connector 224-2 to each of the enclosure manager modules coupled to a connector 224-4. The number of wires and/or optical fibers can be high-speed and/or low-speed for the transmitting signals between the blade server modules, switch modules, storage modules, enclosure manager modules, front fan modules, and rear fan modules.

Figure 3A:
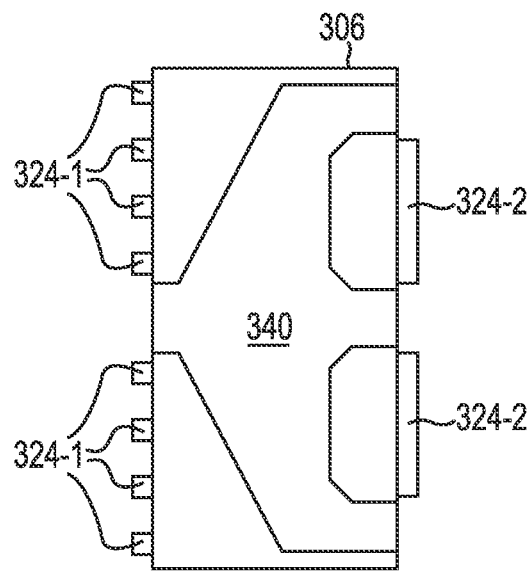
FIG. 3A illustrates a top view of the middle section of a blade enclosure showing a plenum in the middle section of a blade enclosure according to the present disclosure.

FIG. 3A illustrates a top view of the middle section of a blade enclosure showing a plenum in the middle section of a blade enclosure according to the present disclosure. FIG. 3A illustrates connectors 324-1 and connectors 324-2 of middle section 306. Connectors 324-1 can couple middle section 360 to a number of blade server modules. Connectors 324-2 can couple middle section 306 to a number of switch modules. In FIG. 3A, middle section 306 includes plenum 340. Plenum 340 can be included in middle section 306 to allow airflow between openings in middle section 306, such as between opening 230 in FIG. 2A and openings 234 and 236 in FIG. 2B. Plenum 340 can receive air from a front fan module that is pushed into the plenum 340 by a fan in the front fan module. The air can travel through the plenum 340 to switch modules and/or enclosure manager modules coupled to middle section 306. The air can travel from the front fan modules to the switch modules and/or enclosure manager modules through the plenum 340 to cool the switches and/or enclosure managers in the switch modules and/or enclosure manager modules. Plenum 340 can be configured in middle section 306 to lead from an opening in middle section 306, such as opening 230 in FIG. 2A, to other openings in middle section 306, such as openings 234 and 236 in FIG. 2B, while still allowing for room in middle section 306 for the number of wires that couple the connectors on middle section 306 together.

Figure 3B:
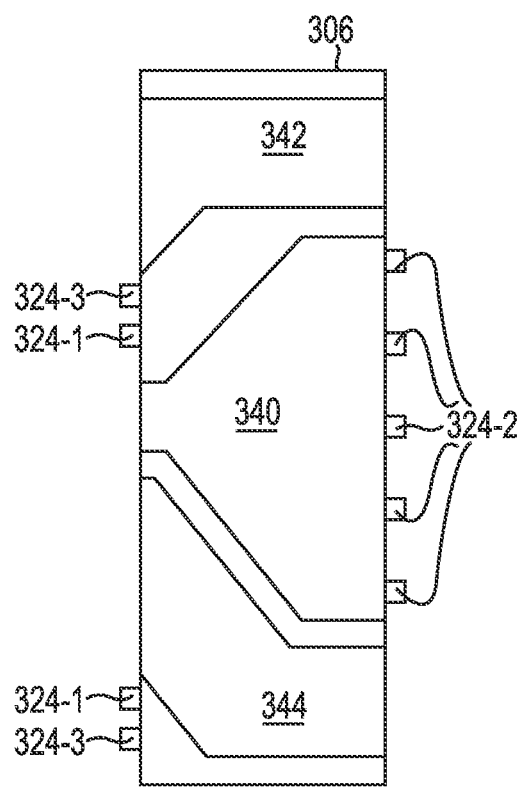
FIG. 3B illustrates a side view of the middle section of a blade enclosure showing plenums in the middle section of a blade enclosure according to the present disclosure.

FIG. 3B illustrates a side view of the middle section of a blade enclosure showing plenums in the middle section of a blade enclosure according to the present disclosure. FIG. 3B illustrates connectors 324-1, connectors 324-2, and connectors 324-3 of middle section 306. Connectors 324-1 can couple middle section 306 to a number of blade server modules, connectors 324-2 can couple middle section 306 to a number of switches modules, and connectors 324-3 can couple middle section 306 to a number of storage modules.

As illustrated in FIG. 3B, middle section 306 includes plenum 340 to allow airflow between openings in middle section 306, such as between opening 230 in FIG. 2A and openings 234 and 236 in FIG. 2B. In FIG. 3B, middle section 306 includes plenums 342 and 344. Plenums 342 and 344 can be included in middle section 306 to allow airflow between openings in middle section 306, such as between openings 226 and 228 in FIG. 2A and openings 232 in FIG. 2B. Plenum 342 and 344 can receive air from blade server modules and/or storage modules that is pulled into the blade server modules and/or a storage modules and plenums 342 and 344 by fans in rear fan modules. The air can travel through the plenum 342 and 344 to rear fan modules coupled to middle section 306. The air can travel from the front of the blade enclosure through the blade server modules and/or storage modules to the plenum 340 and the rear fan modules to cool the blades and/or storage components in the blade server modules and/or storage modules. Plenums 342 and 344 can be configured in middle section 306 to lead from openings in middle section 306, such as openings 226 and 228 in FIG. 2A, to other openings in middle section 306, such as openings 232 in FIG. 2B, while still allowing for room in middle section 306 for the number of wires that couple the connectors on middle section 306 together.

Figure 4:
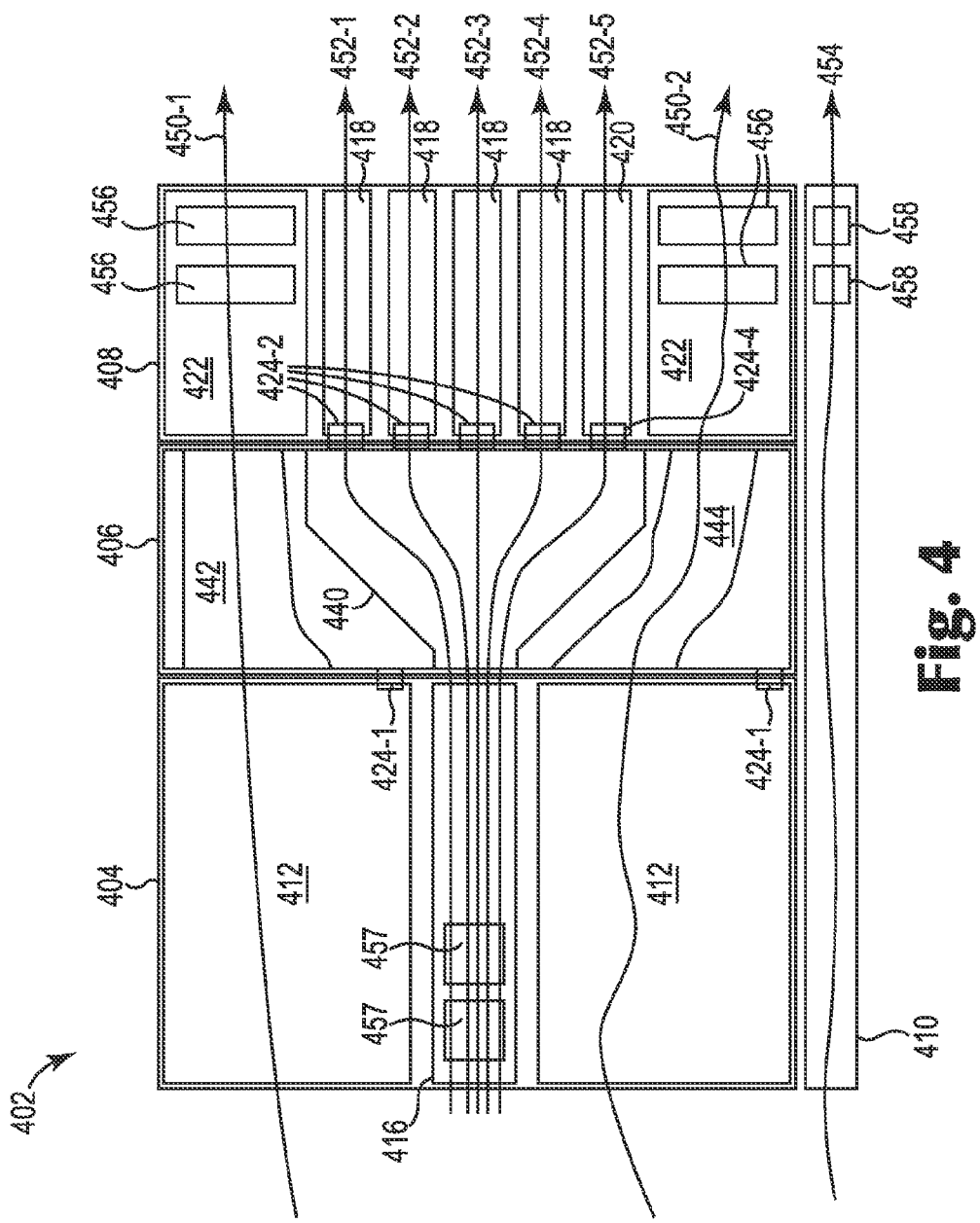
FIG. 4 illustrates airflow paths in a blade enclosure according to the present disclosure.

FIG. 4 illustrates airflow paths in a blade enclosure according to the present disclosure. FIG. 3 illustrates airflow paths 450-1, 450-2, 452-1, 452-2, 452-3, 452-4, 452-5, and 454 through blade enclosure 402. FIG. 4 illustrates blade server modules 412 in front section 404 coupled to middle section 406 via connectors 424-1, switch modules 418 in rear section 408 coupled to middle section 406 via connectors 424-2, and enclosure manager module 420 coupled to middle section 406 via connector 424-4. In some examples, a storage module (not shown) can be coupled to middle section 406 via a connector (not shown).

Airflow paths 450-1 and 450-2 illustrate the airflow from the front section 404 of blade enclosure 402 through middle section 406 to rear section 408. In some examples, rear section 408 can include rear fan modules 422. Rear fan modules 422 can include fans 456 to pull air from the front of blade enclosure 402 through blade server modules 412 and/or storage modules (not shown) and into middle section 406. The air can enter middle section 406 through openings in middle section 406, such as openings 226 and 228 in FIG. 2A. The openings through which air from airflow paths 450-1 and 450-2 enters middle section 406 from front section 404 can be associated with louvers that are actuated and opened when blade server modules 412 and/or storage modules (not shown) are coupled to middle section 406. The air from airflow 450-1 can pass through middle section 406 via plenum 442 and the air from airflow 450-2 can pass through middle section 406 via plenum 444. The air from airflow paths 450-1 and 450-2 can enter rear section 408 through openings in middle section 406, such as openings 232 in FIG. 2B. The openings through which air from airflow paths 450-1 and 450-2 enters rear section 408 from plenums 442 and 444 in middle section 406 can be associated with louvers that are actuated and opened when rear fan modules 422 are coupled to middle section 406. The air can be pulled through rear fan modules 422 by fans 456 and exit out of the rear section 408. The airflow paths 450-1 and 450-2 can cool blades and storage components in the front section 404 by pulling air from the front of the blade enclosure 402 through blade server modules 412 and/or storage modules (not shown), plenums 442 and 444, and rear fan modules 422 and out the rear section 408 with fans 456.

Airflow paths 452-1, 452-2, 452-3, 452-4, and 452-5 illustrate the airflow from the front section 404 of blade enclosure 402 through middle section 406 to rear section 408. In some examples, front section 404 can include front fan module 416. Front fan module 416 can include fans 457 to push air from the front of blade enclosure 402 through the front fan module 416 and into middle section 406. The air can enter middle section 406 through openings in middle section 406, such as opening 230 in FIG. 2A. The opening through which air from airflow paths 452-1, 452-2, 452-3, 452-4, and 452-5 enters middle section 406 from front section 404 can be associated with louvers that are actuated and opened when the front fan module 416 are coupled to middle section 406. The air from airflow paths 452-1, 452-2, 452-3, 452-4, and 452-5 can pass through middle section 406 via plenum 440. The air can enter rear section 408 through openings in middle section 406, such as openings 234 and 236 in FIG. 2B. The openings through which air from airflow paths 452-1, 452-2, 452-3, 452-4, and 452-5 enters rear section 408 from plenum 440 in middle section 406 can be associated with louvers that are actuated and opened when switch modules 418 and/or enclosure manager modules 420 are coupled to middle section 406. The air can be pushed through switch modules 418 and/or enclosure manager modules 420 by fans 457 in the front fan module 416 and exit out of the rear section 408. The airflow paths 452-1, 452-2, 452-3, 452-4, and 452-5 can cool switches and enclosure manager components in the rear section 408 by pushing air from the front of the blade enclosure 402 through the front fan module 416, plenum 440, switch modules 418, and/or enclosure manager modules 420 and out the rear section 408 with fans 457 in the front fan module 416.

Airflow path 454 illustrates the airflow through the lower section 410 of the blade enclosure 402. The lower section 410 can include a number of power modules that supply power the components of the front section 404, middle section 406, and rear section 408 of blade enclosure 402. In some examples, lower section 410 can include fans 458. The air in airflow path 454 can be pulled into lower section 410 by fans 458 in lower section 410 and the air can pass through the lower section 410 to cool the power modules in the lower section 410. The air in airflow path 454 can exit out the rear of the lower section 410.

In some examples, airflow paths 450-1 and 450-2 can use fans 456 and plenums 442 and 444 to provide independent airflow paths to cool the blade server modules and storage modules. Airflow paths 452-1, 452-2, 452-3, 452-4, and 452-4 can use fans 457 and plenum 440 to provide independent airflow paths to cool the switch modules and enclosure manager modules. Airflow path 454 can use fans 458 to provide an independent airflow path to cool the power modules It is to be understood that the above description has been made in an illustrative fashion, and not a restrictive one. Although specific examples have been illustrated and described herein, other component arrangements, instructions, and/or device logic can be substituted for the specific examples shown.

What is claimed:
1. A blade enclosure, comprising:
   a front section to house blade server modules;
   a rear section to house switch modules; and
   a middle section having
   a first plenum for a first airflow path from the blade server modules through the middle section to the rear section,
   a second plenum for a second airflow path from the front section through the middle section to the switch modules,
   a number of openings, including openings to couple the blade server modules to the first plenum and openings to couple the switch modules to the second plenum, and
   a number of connectors, wherein the middle section controls the first airflow path independently of the second airflow path via couplings to the number of openings, and the middle section controls signal connectivity between in the blade server modules and the switch modules with the number of connectors.

2. The enclosure of claim 1, wherein each of the openings to couple the blade server modules to the first plenum is associated with a louver that is actuated and opened to allow airflow through the each of the openings, and the louver is actuated by an actuation signal from a blade server module of the blade server modules that is coupled to the opening associated with the louver.

3. The enclosure of claim 1, wherein the number of connectors are coupled to each other by a number of wires.

4. The enclosure of claim 3, wherein the number of wires include high-speed copper wires and low-speed copper wires for managing signal connectivity between the blade server modules and the switch modules.

5. The enclosure of claim 1, wherein each of the number of connectors have a number of degrees of freedom for movement in the middle section.

6. A blade enclosure, comprising:
a front section to house blade server modules and front fan modules;
a rear section to house switch modules and rear fan modules; and
a middle section that includes:
first connectors to couple to the blade server modules and second connectors to couple to the switch modules, wherein the first connectors are coupled to the second connectors via wires to manage signal connectivity between the blade server modules and the switch modules,
openings including first openings to couple to the blade server modules, second openings to couple to the rear fan modules, third openings to couple to the switch modules, and a fourth opening to couple to the front fan modules,
a first plenum that leads from the first openings to the second openings, and
a second plenum that leads from the fourth opening to the third openings,
wherein first airflow paths through the blade server modules, first openings, first plenum, second openings, and rear fan modules is independent of second airflow paths through the front fan modules, the fourth opening, the second plenum, the third openings, and the switch modules.

7. The enclosure of claim 6, wherein the first plenum is to route air through the middle section between the blade server modules and the rear fan modules.

8. The enclosure of claim 6, wherein the rear fan modules include fans to pull air from the blade server modules through the first plenum into the rear fan modules.

9. The enclosure of claim 6, wherein the second plenum is to route air through the middle section between the front fan modules and the switch modules.

10. The enclosure of claim 6, wherein the front fan modules include fans to push air from the front fan modules through the second plenum into the switch modules.

11. A system for controlling airflow and signal connectivity in a blade enclosure, the system comprising:
a front section having blade server modules, storage modules, and front fan modules;
a rear section having switch modules, enclosure manager modules, and rear fan modules; and a middle section having
a number of openings, including openings to couple to the blade server modules, openings to couple to the storage modules, an opening to couple to the front fan modules, openings to couple to the switch modules, openings to couple to the enclosure manager modules, and openings to couple to the rear fan modules,
first plenums leading from the openings to couple to the blade server modules and the openings to couple to the storage modules to the openings to couple to the rear fan modules,
a second plenum leading from the opening to couple to the front fan modules to the openings to the switch modules and the openings to the enclosure manager modules, and
a number of connectors,
wherein airflow is routed from the front fan modules through the second plenum to the switch modules and the enclosure manager modules independently of airflow routed from the blade server modules and the storage modules through the first plenums to the rear fan modules, and
signal connectivity between the blade server modules, the storage modules, the switch modules, and the enclosure manager modules is controlled by the number of connectors coupled to each other via wires.

12. The system of claim 11, wherein controlling the signal connectivity includes routing signals between the blade server modules, the storage modules, the switch modules, and the enclosure manager modules on highspeed wires and low-speed wires.

13. The enclosure of claim 1, wherein the front section is to house a front fan module,
the rear section is to house a rear fan module,
the front fan module is to push air into the second plenum and into the switch modules, along the second airflow path, and
the rear fan module is to pull air from the blade server modules into the first plenum, along the first airflow path.

14. The enclosure of claim 1, wherein each of the openings to couple the switch modules to the second plenum is associated with a louver that is actuated and opened to allow airflow through the each of the openings, and
the louver is actuated by an actuation signal from a switch module of the switch modules that is coupled to the opening associated with the louver.

15. The enclosure of claim 6, wherein a quantity of first openings differs from a quantity of second openings, and
a quantity of the fourth opening differs from a quantity of the third openings.

16. The enclosure of claim 6, comprising:
louvers associated with respective first openings that are actuated and opened by respective blade server modules to allow airflow through the respective first openings;
louvers associated with respective second openings that are actuated and opened by respective rear fan modules to allow airflow through the respective second openings;
louvers associated with respective third openings that are actuated and opened by respective switch modules to allow airflow through the respective third openings; and a louver associated with the fourth opening that is actuated and opened by the front fan module to allow airflow through the fourth opening.

17. The system of claim 11, wherein the front fan modules are to push airflow into the second plenum and into the switch modules and the enclosure manager modules, and the rear fan modules are to pull airflow from the blade server modules into the first plenum.

18. The system of claim 11, comprising louvers associated with the openings to couple to the blade server modules, the openings to couple to the storage modules, the opening to couple to the front fan modules, the openings to couple to the switch modules, the openings to couple to the enclosure manager modules, or the openings to couple to the rear fan modules, and actuated to allow airflow by the blade server modules, the storage modules, the front fan modules, the switch modules, the enclosure manager modules, or the rear fan modules, respectively.

19. The system of claim 11, wherein a quantity of the opening to couple to the front fan modules differs from a quantity of the openings to the switch modules and the openings to the enclosure manager modules.

* * * * *